United States Patent [19]
Park et al.

[11] Patent Number: 5,625,230
[45] Date of Patent: Apr. 29, 1997

[54] INTEGRATED CIRCUIT CHIP STRUCTURE

[75] Inventors: Jin-woo Park, Suwon; Chang-hoon Lee, Seoul, both of Rep. of Korea

[73] Assignee: Samsung Display Devices Co., Ltd., Suwon, Rep. of Korea

[21] Appl. No.: 532,984

[22] Filed: Sep. 22, 1995

[30] Foreign Application Priority Data

Dec. 28, 1994 [KR] Rep. of Korea .................. 94-38300

[51] Int. Cl.$^6$ ................................................ H01L 23/48
[52] U.S. Cl. ......................... 257/736; 257/737; 257/778
[58] Field of Search ........................... 257/737, 736, 257/778

[56] References Cited

U.S. PATENT DOCUMENTS

| | | | |
|---|---|---|---|
| 5,336,547 | 8/1994 | Kawakita et al. | 257/737 |
| 5,477,087 | 12/1995 | Kawakita et al. | 257/778 |
| 5,508,561 | 4/1996 | Tago et al. | 257/778 |

OTHER PUBLICATIONS

IBM Technical Disclosure Bulletin "Encapsulated Solder Joint for Chip Mounting" vol. 32 No. 10B Mar. 1990 p. 480.

*Primary Examiner*—Sara W. Crane
*Assistant Examiner*—Roy Potter
*Attorney, Agent, or Firm*—Rothwell, Figg, Ernst & Kurz

[57] ABSTRACT

An integrated circuit chip structure, which prevents electrical shorts between adjacent electrodes and contributes to miniaturization, and a method for forming an integrated circuit chip structure are provided. A first electrode of a predetermined pattern is formed on the integrated circuit chip and a second electrode is formed on a base in correspondence with the first electrode. A first adhesive made of elastomer is deposited on the second electrode and a conductive metal substance is coated thereon. Finally, the second electrode is joined with the first electrode by pressure, after a second adhesive is deposited on the upper surface of the metal substance.

22 Claims, 4 Drawing Sheets

FIG.7
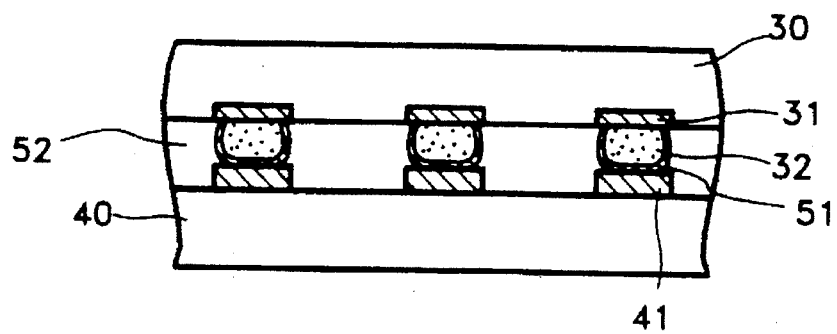
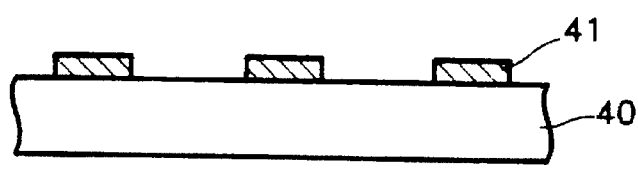
FIG.8A
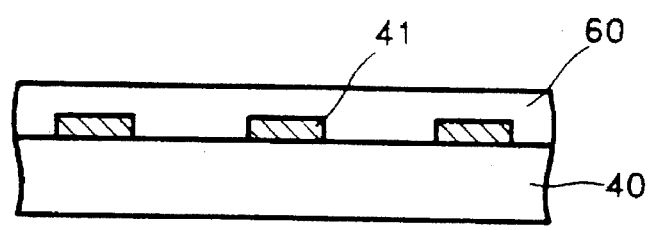
FIG.8B
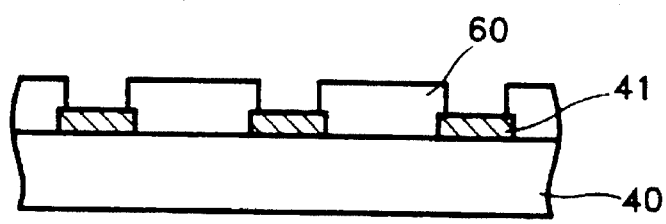
FIG.8C
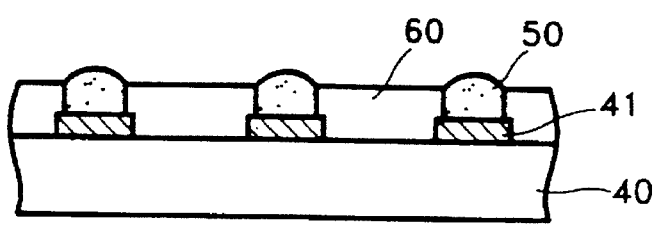
FIG.8D

INTEGRATED CIRCUIT CHIP STRUCTURE

BACKGROUND OF THE INVENTION

The present invention relates to an integrated circuit chip structure and a method for forming the integrated circuit chip structure, and more particularly, to an integrated circuit chip structure where shorts between adjacent electrodes and a stress due to the electrode contact are prevented. The present invention also relates to a method for forming the integrated circuit chip structure.

A conventional integrated circuit chip structure is shown in FIG. 1. Referring to FIG. 1, a predetermined pattern of electrodes 11 are formed on a base 10, and an electrode 21 and a bump 22 made of gold are stacked on an integrated circuit chip in correspondence with each electrode 11. These constituents are joined by a conductive anisotropy-paste 15. Here, conductive paste 15 is made by mixing metal (e.g., nickel) particles with non-conductive adhesive.

However, in the above integrated circuit chip structure, the conductive paste 15 may generate a short between electrodes having a fine pitch. Also, it is difficult to evenly control the distribution of the metal particles within conductive paste 15 when conductive paste 15 is made by mixing the conductive particles such as nickel with the adhesive. Moreover, electrode 11 and bump 22 may crack due to the stress generated when electrode 11 and bump 22 press against each other.

SUMMARY OF THE INVENTION

To solve the above problems, it is an object of the present invention to provide an integrated circuit chip structure which is capable of preventing inter-electrode short even when the electrode-pitch is fine and preventing electrode cracking generated when an integrated circuit chip is attached to a base.

It is another object of the present invention to provide a method for forming the above integrated circuit chip structure.

According to the present invention, there is provided an integrated circuit chip structure comprising an integrated circuit chip on which a first electrode of a predetermined pattern is formed, and a base on which a second electrode is formed in correspondence with the first electrode. The chip and base being joined are electrically connected to each other, wherein a first adhesive is attached to the upper surface of one of the first and second electrodes, a conductive metal substance for electrically contacting the other of the electrodes is deposited around the first adhesive, and a second adhesive for joining the conductive metal substance and the other of the electrodes is deposited on the conductive metal substance.

According to the present invention, there is provided an integrated circuit chip structure comprising an integrated circuit chip on which a first electrode of a predetermined pattern is formed and wherein a conductive bump is formed on the first electrode. The present invention also comprises a base on which a second electrode is formed in correspondence with the first electrode. The chip and base are electrically joined, wherein a first adhesive is attached on the upper surface of the second electrode, a conductive metal substance for electrically contacting the bump is deposited around the first adhesive and a second adhesive for joining the conductive metal substance and the bump is deposited therebetween.

According to the present invention, there is provided an integrated circuit chip structure comprising an integrated circuit chip on which a first electrode of a predetermined pattern is formed and wherein a conductive bump is formed on the first electrode. The present invention also comprises a base on which a second electrode is formed in correspondence with the first electrode. The chip and base are electrically joined, wherein the bump is formed of a first adhesive, a conductive metal substance is deposited around the first adhesive, and a second adhesive is deposited on the surface of the conductive metal substance.

According to the present invention, there is provided a method for forming an integrated circuit chip structure by joining an integrated circuit chip on which a first electrode is formed to a base where a second electrode is formed in correspondence with the first electrode, the method comprising the steps of: depositing a first adhesive on the upper surface of the second electrode; coating conductive metal substance on the upper surface of the first adhesive to be electrically connected with the second electrode; and joining the first electrode and the conductive metal substance to be electrically connected by pressing.

According to the present invention, there is provided a method for forming an integrated circuit chip structure by electrically joining an integrated circuit chip on which a first electrode of a predetermined pattern is formed (and having a conductive bump formed on the first electrode) to a base where a second electrode is formed in correspondence with the first electrode, the method comprising the steps of: depositing a first adhesive on the upper surface of the second electrode; coating conductive metal substance on the upper surface of the first adhesive to be electrically connected with the second electrode; and joining the bump and the conductive metal substance to be electrically connected by pressing.

According to the present invention, stress generation between the first electrode and second electrode can be prevented by utilizing the first adhesive between the electrodes thereby preventing damage such as electrode cracking. Also, the electrical short generation from between the adjacent electrodes can be prevented since the junction is performed by depositing the adhesive only between the corresponding surfaces of the electrodes. The conductivity is improved by depositing the metal substance on the upper surface of the second adhesive for buffering function when the corresponding electrodes are joined with each other.

The integrated circuit chip structure and the method for forming the integrated circuit chip structure according to the present invention, having the above merits, can be applied to very small products having a fine electrode pitch.

BRIEF DESCRIPTION OF THE DRAWINGS

The above objects and advantages of the present invention will become more apparent by describing in detail preferred embodiments thereof with reference to the attached drawings in which:

FIGS. 6 and 7 are sectional views showing an integrated circuit chip structure according to still another preferred embodiment of the present invention; and FIGS. 8A–8I are process-diagrams for illustrating a method for forming an integrated circuit chip structure according to the present invention.

DETAILED DESCRIPTION OF THE INVENTION

Figure 1:
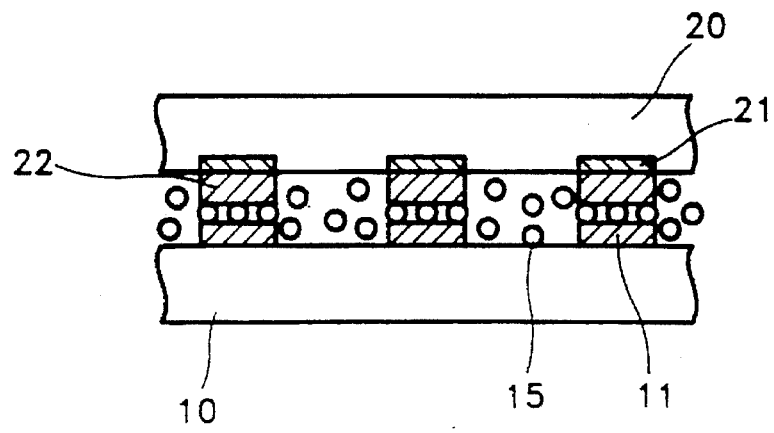
FIG. 1 is a sectional view showing a conventional integrated circuit chip structure.
Figure 2:
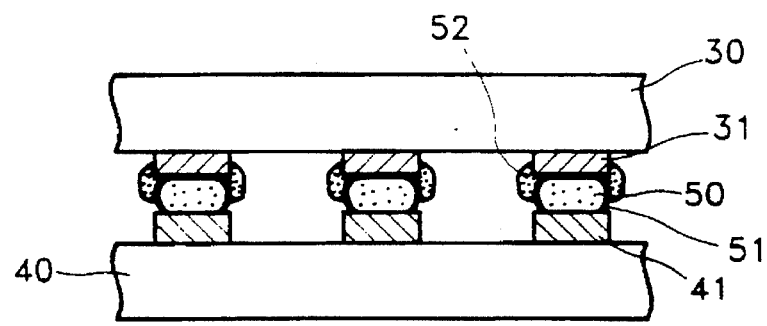
FIGS. 2 and 3 are sectional views showing an integrated circuit chip structure according to a preferred embodiment of the present invention.

Referring to FIG. 2, a plurality of first electrodes 31 are formed in a predetermined pattern on the lower surface of an integrated circuit chip 30 and a plurality of second electrodes 41 are formed on the upper surface of a base 40 in correspondence with first electrodes 31.

First adhesive 50 is attached on the upper surface of second electrode 41 and a conductive metal substance 51 which electrically contacts first electrode 31 is deposited around first adhesive 50. Here, conductive metal substance 51 is electrically connected to second electrode 41. Second adhesive 52 is deposited between conductive metal layer 51 and first electrode 31. Here, second adhesive 52 protrudes from the sides of first and second electrodes 31 and 41, as shown in FIG. 2, when integrated circuit chip 30 and base 40 are pressed together. Thus, first and second electrodes 31 and 41 are electrically connected to each other.

First adhesive 50 is made of an elastomer. Also, second adhesive 52 can be either conductive or non-conductive. Alternatively, second adhesive 52 may also be made by mixing conductive metal particles with non-conductive adhesive. Here, the metal particles improve the conductivity by electrically connecting first electrode 31 and conductive metal substance 51.

Figure 3:
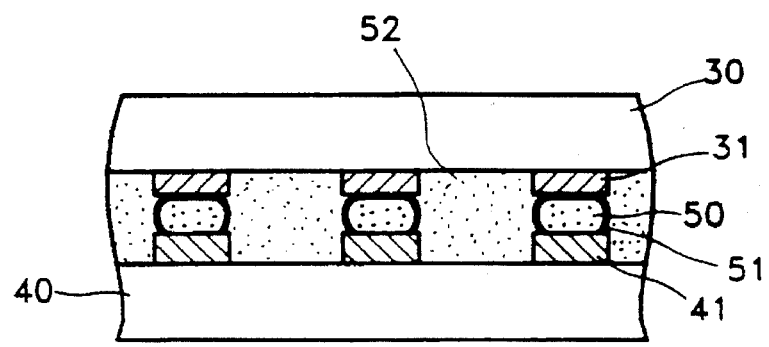

Second adhesive 52 can be overall deposited between integrated circuit chip 30 and base 40 to join integrated circuit chip 30 and base 40, as shown in FIG. 3.

The above integration circuit structure can be joined by the following method.

Figure 8E:
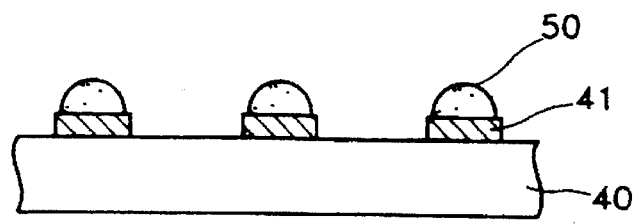

Referring to FIG. 8A, initially, second electrode 41 is formed on the upper surface of base 40 by the deposition method. Similarly, first electrode 31 is formed on the lower surface of integrated circit chip 30 (see FIG. 2). Then, after first adhesive 50 is deposited on the upper surface of second electrode 41, conductive metal substance 51 is deposited around first adhesive 50.

Here, first adhesive 50 is deposited as follows. First, as shown in FIG. 8B, photoresist 60 is deposited on base 40 on which second electrode 41 is formed. As shown in FIG. 8C, photoresist 60 is exposed to light then developed so that part of the upper surface of second electrode 41 is exposed. Then, as shown in FIG. 8D, first adhesive 50 is deposited on the exposed upper surface of second electrode 41. Finally, as shown in FIG. BE, photoresist 60 is completely removed.

Figure 8F:
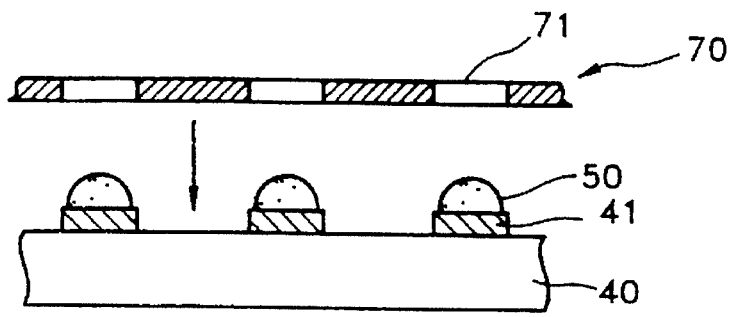
Figure 8G:
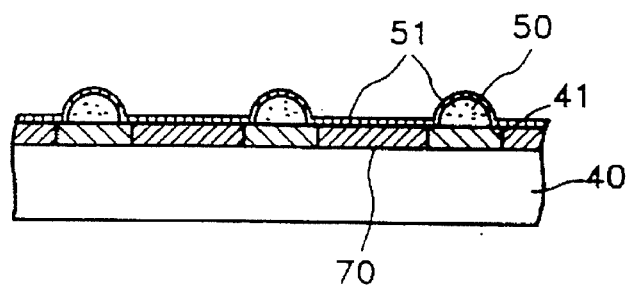

Meanwhile, conductive metal substance 51 can be coated by the deposition method. Here, the coating process is performed as follows. First, as shown in FIG. 8F, a mask 70 of a predetermined pattern is put on base 40 on which first adhesive 50 is deposited. Mask 70 has a plurality of holes 71 for exposing only the upper surface of first adhesive 50 and second electrode 41. Then, as shown in FIG. 8G, conductive metal substance 51 is deposited on the upper surface of mask 70, first adhesive 50 and second electrode 41. Finally, mask 70 is separated from base 40. Conductive metal substance 51 deposited as above is electrically connected to second electrode 41. Conductive or non-conductive adhesive can be used as first adhesive 50. Also, first adhesive 50 may be made of elastomer.

Next, in order to join first electrode 31 and conductive metal substance 51 to be electrically connected, second adhesive 52 is deposited on the upper surface of conductive metal substance 51 by using mask 70. Then, integrated circuit chip 30 is pressed against base 40. Thus, as shown in FIG. 2, first electrode 31 and conductive metal substance 51 are joined. Here, second adhesive 52 protrudes from the side of first electrode 31 and conductive metal substance 51 by the pressure. Second adhesive 52 can be made by mixing conductive metal particles with adhesive.

Figure 8H:
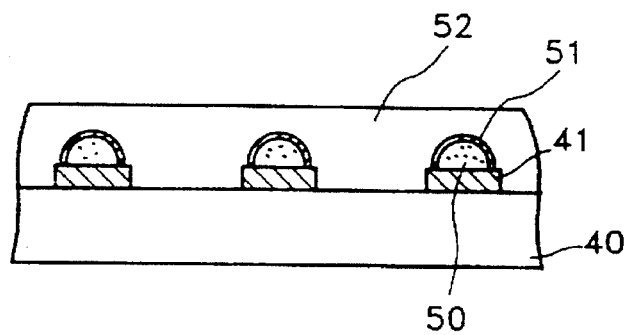
Figure 8I:
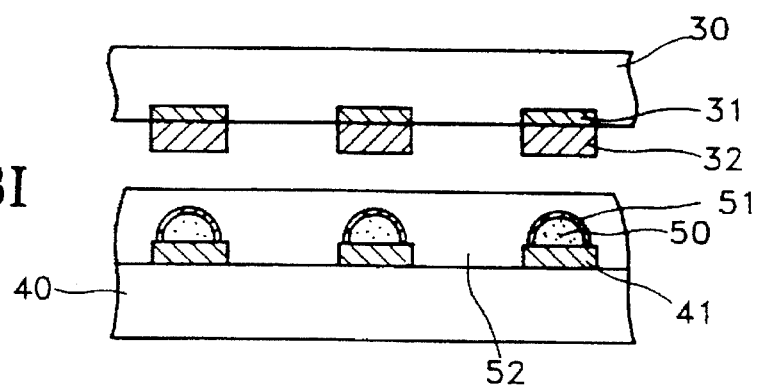

On the other hand, as shown in FIGS. 3, 8H and 8I, second adhesive 52 can be deposited on overall base 40. In this case, non-conductive elastomer is preferably used as second adhesive 52.

Figure 4:
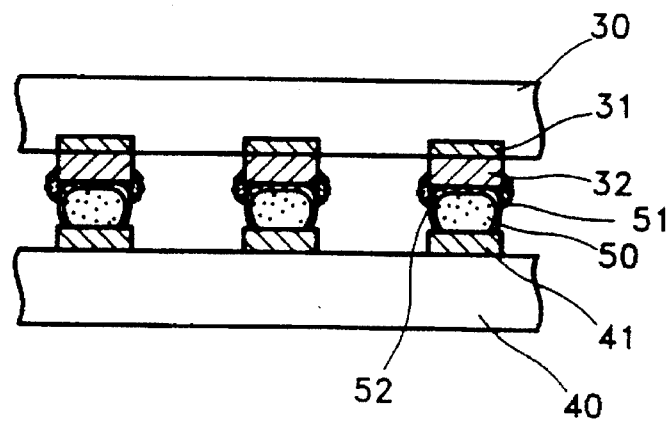
FIGS. 4 and 5 are sectional views showing an integrated circuit chip structure according to another preferred embodiment of the present invention.

Referring to FIG. 4, first electrode 31 and bump 32 of a predetermined pattern are stacked on the lower surface of integrated circuit chip 30, and second electrode 41 is formed on the upper surface of base 40 in correspondence with bump 32.

First adhesive 50 is attached on the upper surface of second electrode 41, and conductive metal substance 51 which is electrically contacted with bump 32 is deposited around first adhesive 50. Here, conductive metal substance 51 is electrically connected with second electrode 41. Also, second adhesive 52 is deposited between conductive metal substance 51 and bump 32. Second adhesive 52 protrudes from the sides of bump 32 and second electrode 41 by the pressing of integrated circuit chip 30 and base 40 so that bump 32 contacts conductive metal substance 51. As a result, bump 32 and second electrode 41 are electrically connected.

Here, first adhesive 50 is made of elastomer and second adhesive 52 can be formed of non-conductive adhesive or conductive adhesive. Also, second adhesive 52 can be formed by mixing conductive metal particles with non-conductive adhesive. Here, the metal particles improve the conductivity by electrically connecting bump 32 and conductive metal substance 51.

Figure 5:
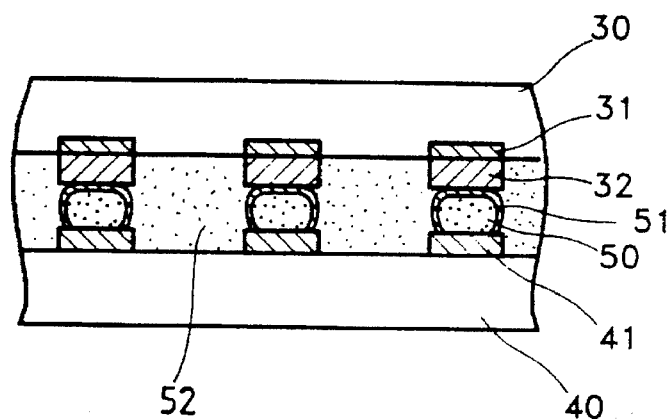

Second adhesive 52 can be overall deposited between integrated circuit chip 30 and base 40 to join integrated circuit chip 30 and base 40, as shown in FIG. 5.

Figure 6:
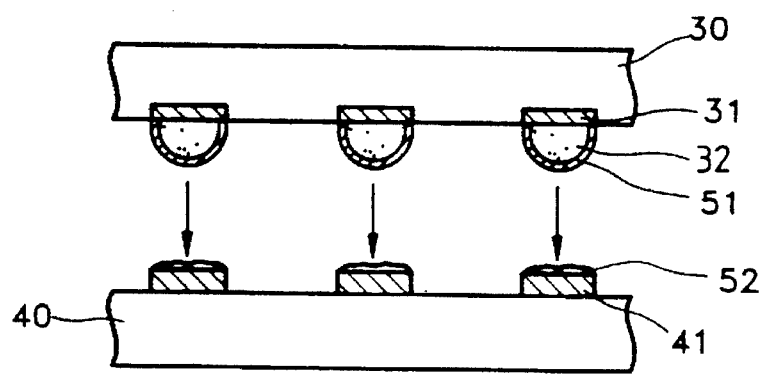

On the other hand, bump 32 can be formed of conductive adhesive, as shown in FIGS. 6 and 7. Alternatively, bump 32 may be formed of an elastomer. Conductive metal substance 51 is coated around bump 32 by the deposition method. Then, second adhesive 52 is deposited on the upper surface of second electrode 41 as shown in FIG. 6. Thereafter, conductive metal substance 51 and second electrode 41 are joined by pressing.

On the other hand, second adhesive 52 can be evenly deposited between integrated chip 30 and base 40, as shown in FIG. 7. In this case, second adhesive 52 is preferably formed of a non-conductive substance. Also, second adhesive 52 may be formed by mixing a non-conductive adhesive with metal particles.

The above integrated circuit chip structure may be formed according to the method as shown in FIGS. 8A–8I.

As described above, the integrated circuit chip structure and the method for forming the integrated circuit chip structure have the following merits.

First, the stress between the pressed electrodes is prevented by adopting first adhesive 50 made of elastomer between first and second electrodes 31 and 41. As a result, damage such as electrode cracking can be prevented.

Second, electrical shorts between adjacent electrodes can be prevented by depositing the adhesive only between the corresponding surfaces of the electrodes.

Third, the metal substance is deposited on the upper surface of the second adhesive for buffering function, so that conductivity is improved when the corresponding electrodes are joined.

The integrated circuit chip structure and the method for forming the same, having the above merits, can be applied to very small products where the pitch between adjacent electrodes is fine.

What is claimed is:

1. An integrated circuit chip structure comprising an integrated circuit chip on which a first electrode of a predetermined pattern is formed, and a base on which a second electrode is formed in correspondence with said first electrode, said chip and base being joined to be electrically connected to each other, wherein a first adhesive is attached to the upper surface of one of said first and second electrodes, conductive metal substance for electrically contacting the other of said electrodes is deposited around said first adhesive, and a second adhesive for joining said conductive metal substance and the other of said electrodes is deposited on the conductive metal substance.

2. An integrated circuit chip structure as claimed in claim 1, wherein said first adhesive is made of elastomer.

3. An integrated circuit chip structure as claimed in claim 1, wherein said second adhesive is non-conductive.

4. An integrated circuit chip structure as claimed in claim 1, wherein said second adhesive comprises a mixture of non-conductive adhesive substance and conductive metal particles.

5. An integrated circuit chip structure as claimed in claim 1, where in said second adhesive comprises means for joining said integrated circuit chip and said base, the joining means is overall deposited between said integrated circuit chip and said base.

6. An integrated circuit chip structure as claimed in claim 1, wherein said second adhesive is deposited only between said metal substance and said other electrode corresponding thereto.

7. An integrated circuit chip structure where an integrated circuit chip on which a first electrode of a predetermined pattern is formed and having a conductive bump formed on said first electrode, and a base on which a second electrode is formed in correspondence with the first electrode, said chip and base being electrically joined, wherein a first adhesive is attached on the upper surface of said second electrode, an conductive metal substance for electrically contacting said bump is deposited around said first adhesive and a second adhesive for joining said conductive metal substance and said bump is deposited therebetween.

8. An integrated circuit chip structure as claimed in claim 7, wherein said first adhesive is made of elastomer.

9. An integrated circuit chip structure as claimed in claim 7, wherein said second adhesive is non-conductive.

10. An integrated circuit chip structure as claimed in claim 7, wherein said second adhesive is formed by mixing non-conductive adhesive substance with conductive metal particles.

11. An integrated circuit chip structure as claimed in claim 7, wherein said second adhesive is overall deposited between said integrated circuit chip and said base to join said integrated circuit chip and said base.

12. An integrated circuit chip structure as claimed in claim 7, wherein said second adhesive is deposited only between said metal substance and said bump corresponding thereto.

13. An integrated circuit chip structure comprising an integrated circuit chip on which a first electrode of a predetermined pattern is formed and having a conductive bump formed on said first electrode, and a base on which a second electrode is formed in correspondence with the first electrode, said chip and base being electrically joined, wherein said bump is formed of a first adhesive, a conductive metal substance is deposited around said first adhesive, and a second adhesive is deposited on the surface of said conductive metal substance.

14. An integrated circuit chip structure as claimed in claim 13, wherein said first adhesive is made of elastomer.

15. An integrated circuit chip structure as claimed in claim 13, wherein said second adhesive is non-conductive.

16. An integrated circuit chip structure as claimed in claim 13, wherein said second adhesive is formed by mixing non-conductive adhesive substance with conductive metal particles.

17. An integrated circuit chip structure as claimed in claim 13, wherein said second adhesive is overall deposited between said integrated circuit chip and said base to join said integrated circuit chip and said base.

18. An integrated circuit chip structure as claimed in claim 13, wherein said second adhesive is deposited only between said metal substance and said bump corresponding thereto.

19. An integrated circuit chip structure as claimed in claim 13, wherein said bump is made of elastomer.

20. An integrated circuit chip structure as claimed in claim 18, wherein said bump is made of elastomer.

21. An integrated circuit chip structure comprising:
 a. an integrated circuit chip, a first electrode of a predetermined pattern formed on said integrated circuit chip;
 b. a base, a second electrode being formed on said base in correspondence with said first electrode, said base and said integrated circuit chip being electrically connected to one another;
 c. a first adhesive attached to an upper surface of one of said first and second electrodes;
 d. a conductive metal substance for electrically contacting the other of said electrodes formed around said first adhesive; and
 e. a second adhesive for joining said conductive metal substance and the other of said electrodes formed on the conductive metal substrate and said other of said electrodes.

22. An integrated circuit chip structure comprising:
 a. an integrated circuit chip, a first electrode of a predetermined pattern formed on said integrated circuit chip and wherein said first electrode has a conductive bump formed thereon;
 b. a base, a second electrode being formed on said base in correspondence with said first electrode, said base and said integrated circuit chip being electrically connected to one another;
 c. a first adhesive attached to an upper surface of said second electrode;
 d. a conductive metal substance for electrically contacting the bump formed around said first adhesive; and
 e. a second adhesive for joining said conductive metal substance and said bump formed between said conductive metal substance and said bump.

* * * * *